United States Patent
Carminati et al.

(10) Patent No.: US 11,086,122 B2
(45) Date of Patent: Aug. 10, 2021

(54) MICROELECTROMECHANICAL DEVICE HAVING A STRUCTURE TILTABLE THROUGH AN ACTUATION OF THE PIEZOELECTRIC TYPE

(71) Applicant: STMicroelectronics S.r.l., Agrate Brianza (IT)

(72) Inventors: Roberto Carminati, Piancogno (IT); Massimiliano Merli, Pavia (IT); Nicolo' Boni, Bergamo (IT)

(73) Assignee: STMicroelectronics S.r.l., Agrate Brianza (IT)

(*) Notice: Subject to any disclaimer, the term of this patent is extended or adjusted under 35 U.S.C. 154(b) by 282 days.

(21) Appl. No.: 16/222,027

(22) Filed: Dec. 17, 2018

(65) Prior Publication Data
US 2019/0196177 A1 Jun. 27, 2019

(30) Foreign Application Priority Data

Dec. 22, 2017 (IT) .......................... 102017000149253

(51) Int. Cl.
| | |
|---|---|
| G02B 26/08 | (2006.01) |
| G02B 26/10 | (2006.01) |
| B81B 3/00 | (2006.01) |
| H04N 1/029 | (2006.01) |
| H04N 9/31 | (2006.01) |

(52) U.S. Cl.
CPC ........ G02B 26/0858 (2013.01); B81B 3/0083 (2013.01); G02B 26/101 (2013.01); G02B 26/105 (2013.01); H04N 1/029 (2013.01); H04N 9/3173 (2013.01)

(58) Field of Classification Search
CPC .............. G02B 26/0858; G02B 26/105; G02B 26/101; B81B 3/0083; H04N 1/029; H04N 9/3173; H04N 9/3129

USPC ....................................................... 359/224.1
See application file for complete search history.

(56) References Cited

U.S. PATENT DOCUMENTS

| | | |
|---|---|---|
| 2014/0368892 A1 | 12/2014 | Mizoguchi |
| 2015/0116806 A1 | 4/2015 | Mizoguchi et al. |
| 2017/0160540 A1* | 6/2017 | Giusti ................ G02B 26/0858 |

FOREIGN PATENT DOCUMENTS

| | | |
|---|---|---|
| EP | 3178783 A1 | 6/2017 |
| JP | 2010286609 A | 12/2010 |

OTHER PUBLICATIONS

IT Search Report and Written Opinion for IT Appl. No. 2017000149253 dated Aug. 7, 2018 (9 pages).

* cited by examiner

*Primary Examiner* — Euncha P Cherry
(74) *Attorney, Agent, or Firm* — Crowe & Dunlevy (57) ABSTRACT

A microelectromechanical device includes a body of semiconductor material, which forms a cavity, a mobile structure, and an actuation structure. The actuation structure includes at least one first deformable element which faces the cavity and is mechanically coupled to the body and to the mobile structure, and a piezoelectric-actuation system which can be controlled so as to deform the first deformable element and cause a consequent rotation of the mobile structure. The mobile structure includes a supporting region and at least one first pillar region, the first pillar region being mechanically coupled to the first deformable element, the supporting region being set on the first pillar region and overlying at least part of the first deformable element.

21 Claims, 11 Drawing Sheets

MICROELECTROMECHANICAL DEVICE HAVING A STRUCTURE TILTABLE THROUGH AN ACTUATION OF THE PIEZOELECTRIC TYPE

PRIORITY CLAIM

This application claims the priority benefit of Italian Application for Patent No. 102017000149253, filed on Dec. 22, 2017, the content of which is hereby incorporated by reference in its entirety to the maximum extent allowable by law.

TECHNICAL FIELD

This disclosure relates to a microelectromechanical device having a structure tiltable through an actuation of a piezoelectric type, such as a quasi-static actuation. In particular, in what follows reference will be made to a picoprojector of a laser type, having a micromirror, obtained with MEMS (Micro-Electro-Mechanical System) technology, without this implying any loss of generality.

BACKGROUND

As is known, there are today available microelectromechanical devices that have a mirror structure obtained with semiconductor technology. These microelectromechanical devices are used in portable apparatuses, such as portable computers, laptops, notebooks (including ultra-thin notebooks), PDAs, tablets, and smartphones, for optical applications, in particular for directing, according to desired modalities, beams of light radiation generated by a light source.

Thanks to their small dimensions, these microelectromechanical devices enable stringent requirements to be met regarding occupation of space in terms of area and thickness.

For instance, microelectromechanical mirror devices are used in miniaturized projector modules (picoprojectors), which are able to project images at a distance or generate desired patterns of light. Such projections may be, for example, a three-dimensional (3D) or two-dimensional (2D) type.

United States Patent Application Publication No. 2017/0160540 (European patent EP 3178783), incorporated by reference, presents a micromechanical device having a tiltable structure; in particular, a micromirror and a picoprojector are described, and are operatively coupled to mobile electronic devices for generation of three-dimensional images. The micromirror is actuated, by piezoelectric actuation, by spring elements, which are set laterally with respect to the micromirror and extend in the plane of the micromirror itself, at rest.

In two-dimensional applications, picoprojectors are used capable of generating a biaxial rotation of a light beam, coming from a light source so as to obtain the desired image. This biaxial rotation is obtained by using a single mirror capable of rotating about two axes (also known as two-dimensional mirror), or else by using a pair of mirrors, each capable of rotating about a corresponding axis (also known as one-dimensional mirrors).

Figure 1:
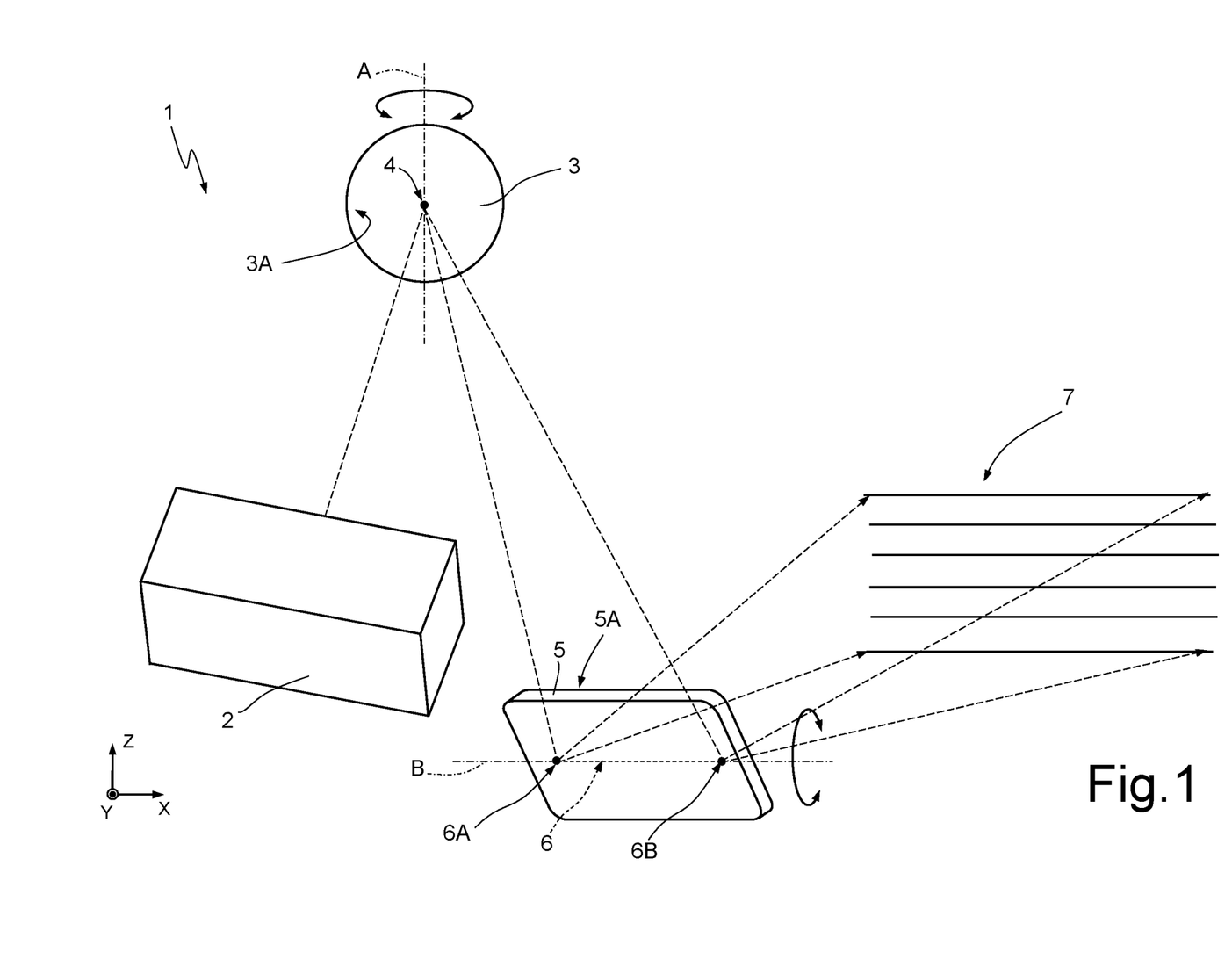
FIG. 1 is a schematic illustration of a picoprojector of a known type.

FIG. 1 shows a simplified diagram of a picoprojector 1 comprising a pair of one-dimensional mirrors.

In detail, the picoprojector 1 comprises: a light source 2 configured for emitting a light beam (for example, of a laser type); a first mirror 3 having a first surface 3A; and a second mirror 5 having a second surface 5A.

In particular, the first mirror 3 is a horizontal mirror of a resonant type, which is able to rotate about a first axis of rotation A, parallel to a first axis Z of a Cartesian reference system XYZ.

The second mirror 5 is a vertical mirror of a linear type, which is able to rotate about a second axis of rotation B, parallel to a second axis X of the Cartesian reference system XYZ.

In use, the first mirror 3 is made to rotate about the first axis of rotation A through mechanical-actuation systems (not illustrated), configured for inducing a rotation at the mechanical resonance frequency of the first mirror 3. The second mirror 5 is made to rotate about the second axis of rotation B by quasi-static actuation systems (for example, of an electromagnetic, electrostatic, or piezoelectric type), which are configured for inducing a rotation at a frequency lower than the resonance frequency of the second mirror 5 so as to obtain a particularly precise projection of the light beam.

The light source 2 emits a light beam in the direction of the first mirror 3; in particular, to a first approximation, the light beam impinges upon the first surface 3A of the first mirror 3 at a first point of incidence 4.

The incident light beam is hence reflected by the first mirror 3 so that the reflected light beam has a direction of propagation in space that depends upon the angular position of the first mirror 3 about the first axis of rotation A.

Next, the reflected light beam impinges upon the second surface 5A of the second mirror 5 in a number of points, to form a line of incidence 6 having a first end 6A and a second end 6B.

The light beam that impinges upon the second mirror 5 and generates the line of incidence 6 is then reflected by the second mirror 5 so as to form a scanning pattern 7, for example on a screen (not illustrated).

In general, it is possible to control in a precise way rotation of the second mirror 5 in order to form the desired scanning pattern.

The microelectromechanical devices described present some disadvantages. In particular, as already discussed previously, the second mirror 5 is actuated in a quasi-static way. Consequently, the actuation force required for inducing rotation is high. It follows that, using actuation of an electrostatic or electromagnetic type, the actuation voltage required is high; moreover, in the case of actuation of an electromagnetic type, the resulting power consumption is non-negligible.

In addition, the die area occupied by devices of a known type based upon piezoelectric actuation (such as the device described in the European patent EP 3178783) is large. This situation does not allow production of compact devices and causes a sensible increase in the production costs, since the number of devices that can be obtained starting from a single wafer is small.

There is a need in the art to provide a microelectromechanical device that will solve at least in part the drawbacks of the prior art.

SUMMARY

In an embodiment, a microelectromechanical device comprises: body of semiconductor material which includes a cavity; a mobile structure; and an actuation structure, including a first deformable element which faces the cavity and is mechanically coupled to the body and to the mobile structure, and a piezoelectric-actuation system configured to be controlled so as to deform said first deformable element and cause a consequent rotation of the mobile structure. Said mobile structure comprises a supporting region and a first pillar region, said first pillar region being mechanically coupled to said first deformable element, said supporting region being arranged on top of the first pillar region and overlying at least part of said first deformable element.

In an embodiment, a portable electronic apparatus comprises: a projective apparatus comprising: a light source configured to generate a light beam; and a microelectromechanical device configured to receive said light beam and optically coupled to a screen so as to direct said light beam onto the screen. The microelectromechanical device comprises: a body of semiconductor material, which forms a cavity; a mobile structure; and an actuation structure, including at least one first deformable element, which faces the cavity and is mechanically coupled to the body and to the mobile structure, and a piezoelectric-actuation system, configured to be controlled so as to deform said first deformable element and cause a consequent rotation of the mobile structure. The mobile structure comprises a supporting region and a first pillar region, said first pillar region being mechanically coupled to said first deformable element, said supporting region being arranged on top of the first pillar region and overlying at least part of said first deformable element. The mobile structure further comprises a reflecting region arranged on the supporting region.

In an embodiment, a microelectromechanical device comprises: a body of semiconductor material, which forms a cavity; a mobile structure; and an actuation structure. The actuation structure includes: a first deformable element which faces the cavity and is mechanically coupled to the body and to the mobile structure; a first piezoelectric-actuation system configured to be controlled so as to deform said first deformable element and cause rotation of the mobile structure; a second deformable element which is laterally staggered with respect to the first deformable element and is mechanically coupled to the body and to the mobile structure; and a second piezoelectric-actuation system configured to be controlled so as to deform said second deformable element and contribute to causing rotation of the mobile structure. The mobile structure comprises: a first pillar region, said first pillar region being mechanically coupled to said first deformable element; a second pillar region, said second pillar region being mechanically coupled to said second deformable element; and a supporting region being arranged on top of the first and second pillar regions and overlying at least part of said first and second deformable elements.

BRIEF DESCRIPTION OF THE DRAWINGS

For a better understanding, embodiments are now described, purely by way of non-limiting example, with reference to the attached drawings, wherein.

DETAILED DESCRIPTION

Figure 2:
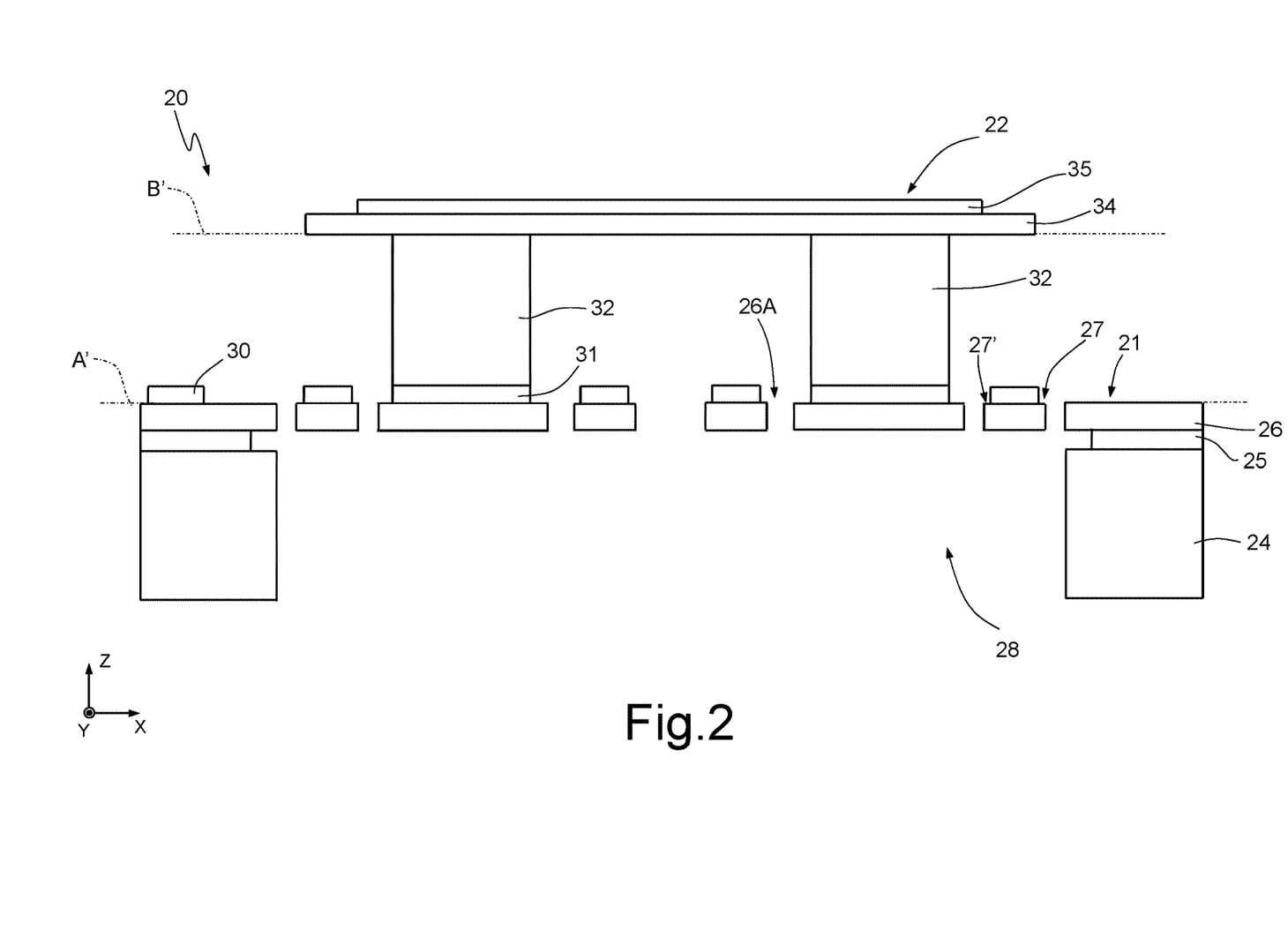
FIG. 2 is a schematic illustration of a cross section taken along a plane of section II-II of FIG. 3 of the present microelectromechanical device.
Figure 3:
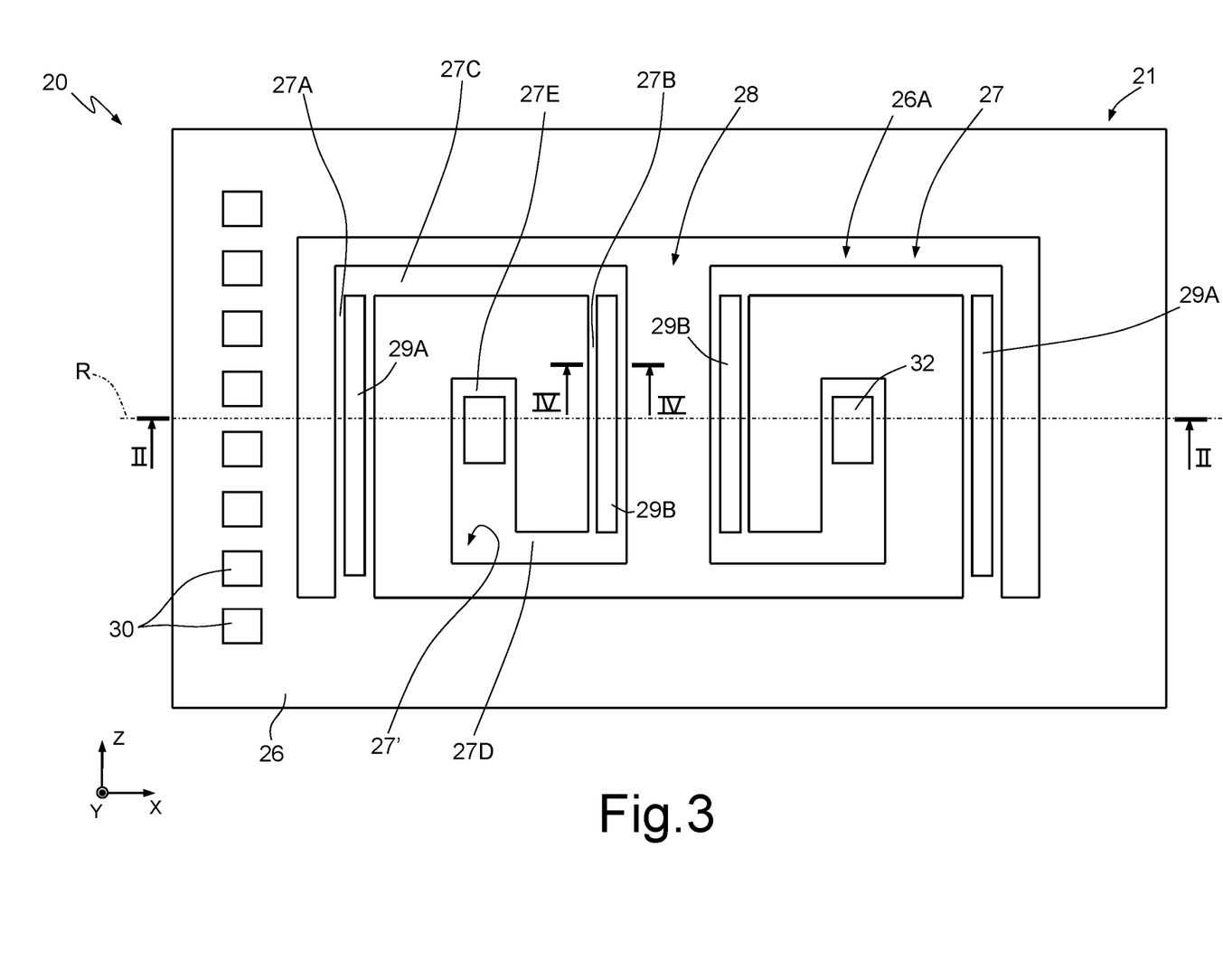
FIG. 3 is a schematic illustration of a top plan view of the microelectromechanical device of FIG. 2 with parts removed.

FIGS. 2 and 3 show a microelectromechanical device 20 (hereinafter also defined and described as micromirror 20); in greater detail, a resting condition of the present micromirror 20 is illustrated.

In particular, as shown in FIG. 2, the micromirror 20 comprises a body 24, made of semiconductor material (for example, silicon). In top plan view, the body 24 has the shape, for example, of a quadrangular frame (for instance, a rectangular frame, as may be seen in FIG. 3) and forms a cavity 28.

The micromirror 20 further comprises an actuation structure 21, arranged in a first plane A', parallel to a plane XY of a cartesian reference system XYZ. The actuation structure 21 is moreover mechanically coupled to the body 24 by a first interposition layer 25, which is made, for example, of silicon oxide and extends over the body 24.

The micromirror 20 also comprises a mobile structure 22, arranged in a second plane B', parallel to the first plane A', and mechanically coupled to the actuation structure 21 by two pillars 32. In particular, the pillars 32 have an elongated shape, are made of semiconductor material (such as silicon) and extend vertically (i.e., parallel to a first axis Z of the reference system XYZ), being arranged between the actuation structure 21 and the mobile structure 22.

In greater detail, the actuation structure 21 comprises a supporting structure 26, which has, for example, the shape, in top plan view, of a quadrangular frame (for instance, a rectangular frame) and is arranged on the first interposition layer 25; moreover, the supporting structure 26 forms a hollow portion 26A (FIG. 3), which communicates with the cavity 28 of the body 24.

The actuation structure 21 further comprises two deformable elements 27 (illustrated in FIG. 3, which is not in scale, as neither are the other figures), fixed to the supporting structure 26 and suspended over the cavity 28 of the body 24. In particular, in resting conditions, the deformable elements (springs) 27 extend in the hollow portion 26A of the supporting structure 26.

The deformable elements 27 are shaped like a spiral; moreover, the deformable elements 27 have shapes that are the same as one another and are arranged symmetrically with respect to an axis parallel to a second axis Y of the Cartesian reference system XYZ.

In particular, each deformable element 27 comprises: a first arm 27A and a second arm 27B, which have an elongated shape and are opposed to one another; a first transverse arm 27C and a second transverse arm 27D, which also have elongated shape; and a spiral end 27E.

In detail, the first and second arms 27A, 27B extend parallel to the second axis Y of the Cartesian reference system XYZ; moreover, the first arm 27A has a first end fixed to the supporting structure 26.

The first and second transverse arms 27C, 27D extend parallel to a third axis X of the Cartesian reference system XYZ. In particular, the first transverse arm 27C branches off from a second end of the first arm 27A, until it comes into contact with a first end of the second arm 27B. The second transverse arm 27D branches off from a second end of the second arm 27B, until it comes into contact with the spiral end 27E. Without this implying any loss of generality, the spiral end 27E also has an elongated shape, parallel to the axis Y, and is arranged between the first and second arms 27A, 27B.

The deformable elements 27 and the supporting structure 26 are obtained starting from a die of semiconductor material, for example silicon, using known techniques of machining of semiconductors, such as digging, growth, deposition, and/or selective removal, in a way in themselves known. The deformable elements 27 and the supporting structure 26 are hence monolithic and are made of semiconductor material.

The actuation structure 21 further comprises, for each deformable element 27, a first piezoelectric band 29A and a second piezoelectric band 29B. In particular, each deformable element 27 is delimited at the top by a first surface 27'; moreover, the first and second piezoelectric bands 29A, 29B extend over the first surface 27'. In greater detail, in each deformable element 27, the corresponding first and second piezoelectric bands 29A, 29B extend on the first and second arms 27A, 27B, respectively.

In practice, the ensemble of the first and second piezoelectric bands 29A, 29B forms a plurality of piezoelectric bands 29. Furthermore, the piezoelectric bands arranged on one of the two deformable elements 27 are arranged in a symmetric way, with respect to the aforementioned axis parallel to the axis Y, to the other piezoelectric bands set on the other deformable element 27.

The actuation structure 21 further comprises a plurality of contact pads 30, arranged on the supporting structure 26, laterally staggered with respect to the hollow portion 26A so as to be arranged in a row in a direction parallel to the third axis Y. In particular, the contact pads 30 are electrically coupled to the plurality of piezoelectric bands 29 by a plurality of electrical connection lines (not illustrated).

Arranged on the spiral end 27E of each deformable element 27 is a corresponding pillar 32. In particular, each pillar 32 has, for example, the shape of a parallelepiped and is fixed to the corresponding spiral end 27E by a second bonding layer 31, made, for example, of polymeric material. Furthermore, as illustrated in FIG. 2, each pillar 32 is formed monolithically with the mobile structure 22.

The mobile structure 22 comprises a planar support 34, which extends over the second plane B' and is made, as mentioned previously, of semiconductor material, such as silicon. In particular, the planar support 34 has a quadrangular shape (for example, rectangular) in top plan view (not illustrated) and has an extension such as to overlie the pillars 32 and at least the portions of deformable elements 27 arranged between the pillars 32 (for example, the second arms 27B and the second piezoelectric bands 29B). More in particular, and without any loss of generality, in the embodiment illustrated in FIG. 2, the planar support 34 overlies, at a distance, the first arms 27A of the deformable elements 27 and the first piezoelectric bands 29A.

Furthermore, the mobile structure 22 comprises a tiltable element 35, which extends over the planar support 34 and is made of reflecting material (such as gold or aluminum). In particular, the tiltable element 35 has a quadrangular shape (for example, rectangular) and is formed on the planar support 34 according to techniques of deposition and definition in themselves known.

Figure 4:
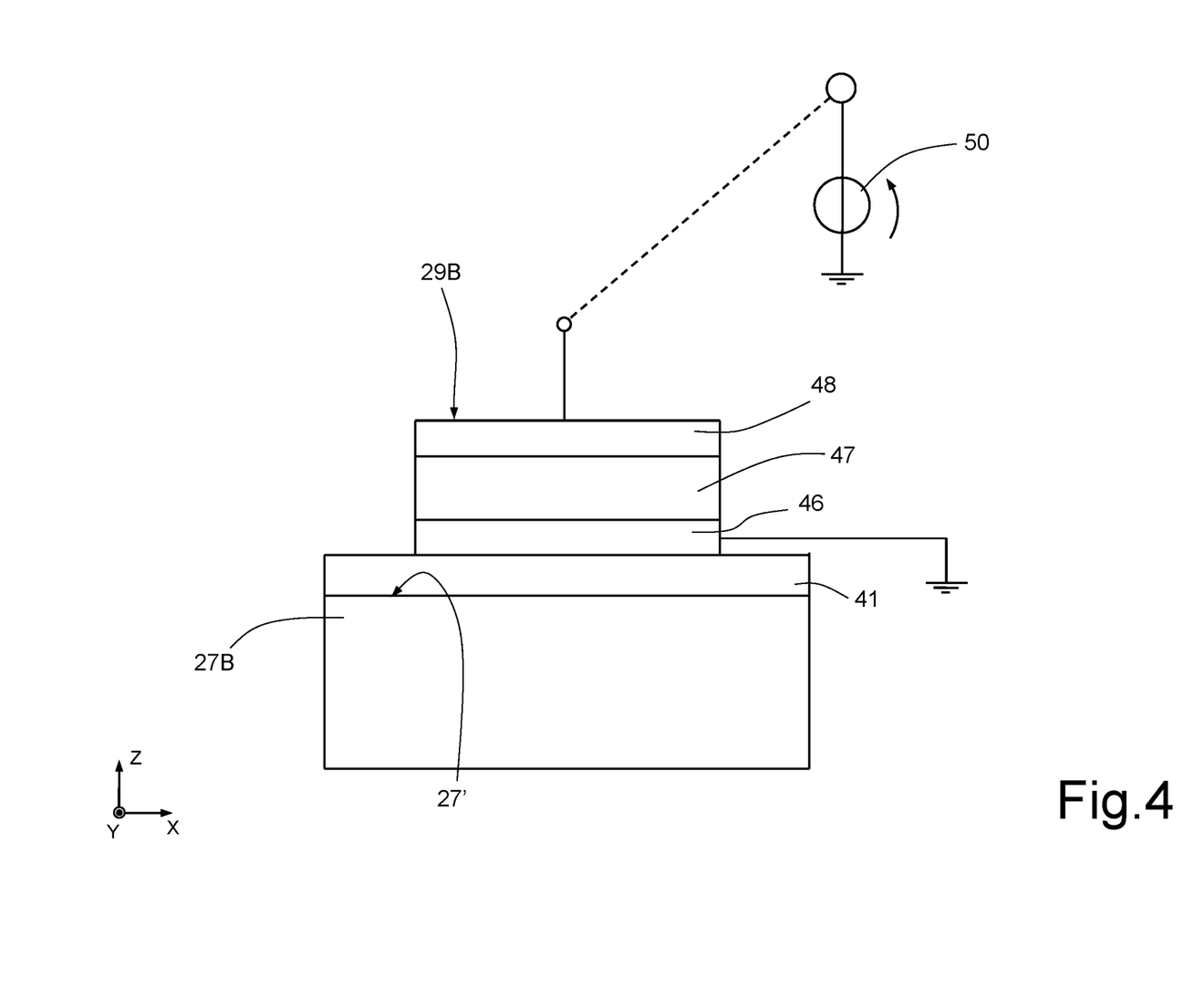
FIG. 4 is a schematic illustration of a cross section taken along a plane of section IV-IV of FIG. 3 of a detail of the present microelectromechanical device.

FIG. 4 shows a detail of a second arm 27B of a deformable element 27 and of the corresponding second piezoelectric band 29B of the plurality of piezoelectric bands 29.

In detail, extending over the second arm 27B is a dielectric layer 41, made, for example, of silicon oxide, in which a plurality of electrical connections (not illustrated) are present, configured for electrically coupling the second piezoelectric band 29B to the contact pads 30.

In addition, the second piezoelectric band 29B extends over the dielectric layer 41. In particular, the second piezoelectric band 29B comprises: a respective first electrode 46, made of conductive material (for example, a metal, such as platinum); a layer of piezoelectric material 47, made, for example, of PZT (Pb, Zr, TiO$_2$), which extends over the first electrode 46; and a second electrode 48, made of conductive material (for example, a metal, such as a titanium and tungsten alloy), which extends over the layer of piezoelectric material 47.

This having been said, the same considerations may be made regarding the structure and arrangement of the first piezoelectric band 29A on the first arm 27A.

In general, the first and second piezoelectric bands 29A, 29B may be electrically represented as a capacitor, the first electrode 46 of which is connected to ground, and the second electrode 48 of which is biased in the way described below.

The first piezoelectric bands 29A of each deformable element 27 are electrically connected to a first voltage generator (not illustrated) through the aforementioned electrical connections. The second piezoelectric bands 29B of each deformable element 27 are electrically connected to a second voltage generator 50 through the aforementioned electrical connections.

Figure 5:
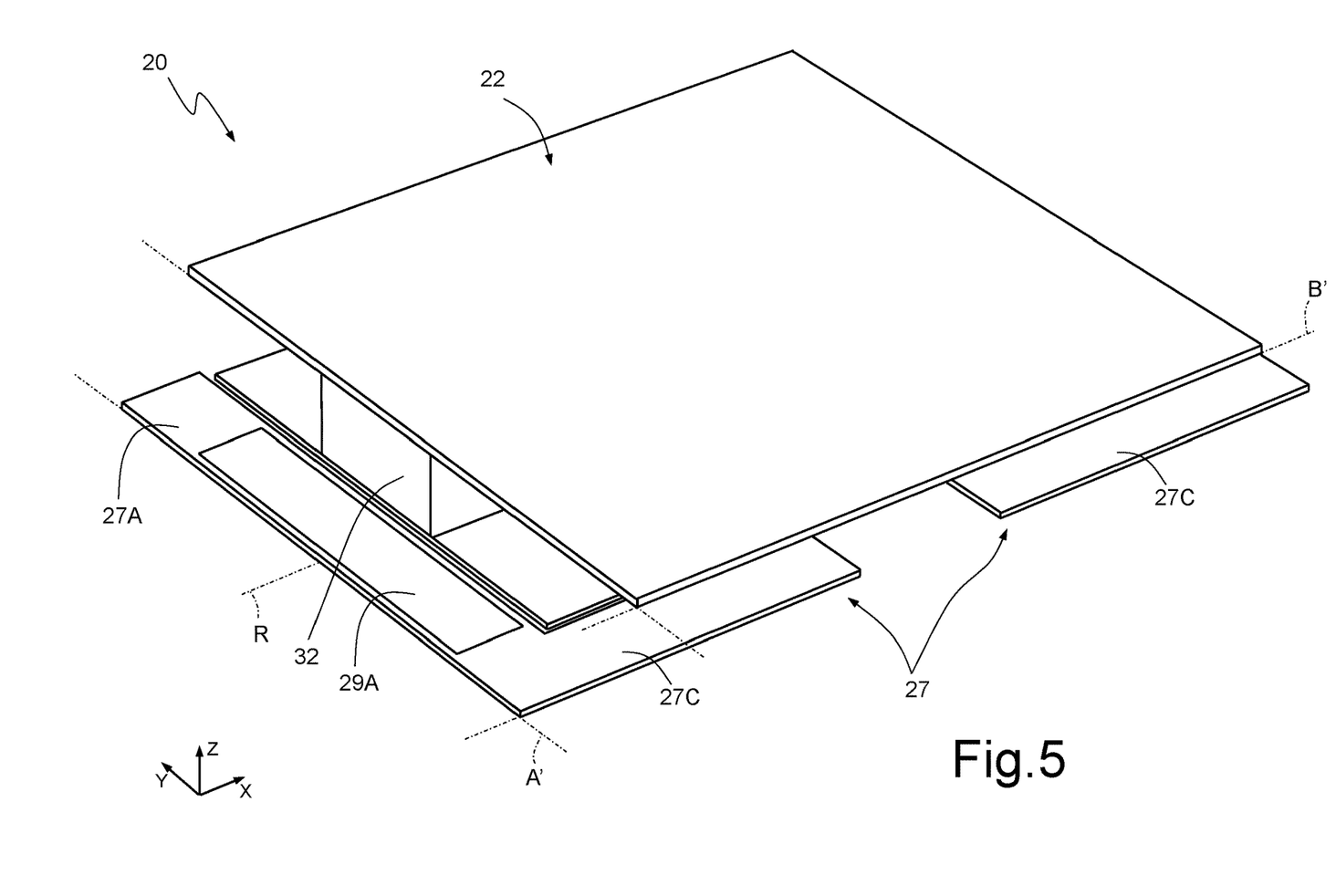
FIG. 5 is a schematic illustration of a simplified perspective view of the microelectromechanical device of FIGS. 2 and 3, with parts removed.
Figure 6:
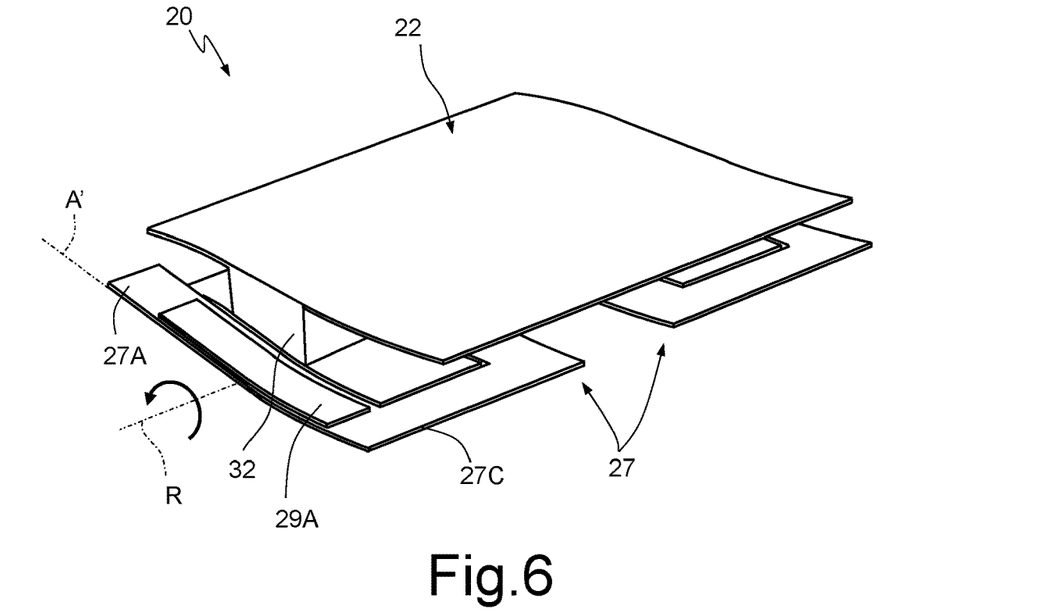
FIG. 6 is a schematic illustration of a simplified perspective view of the microelectromechanical device of FIG. 5 in a first actuation step.
Figure 7:
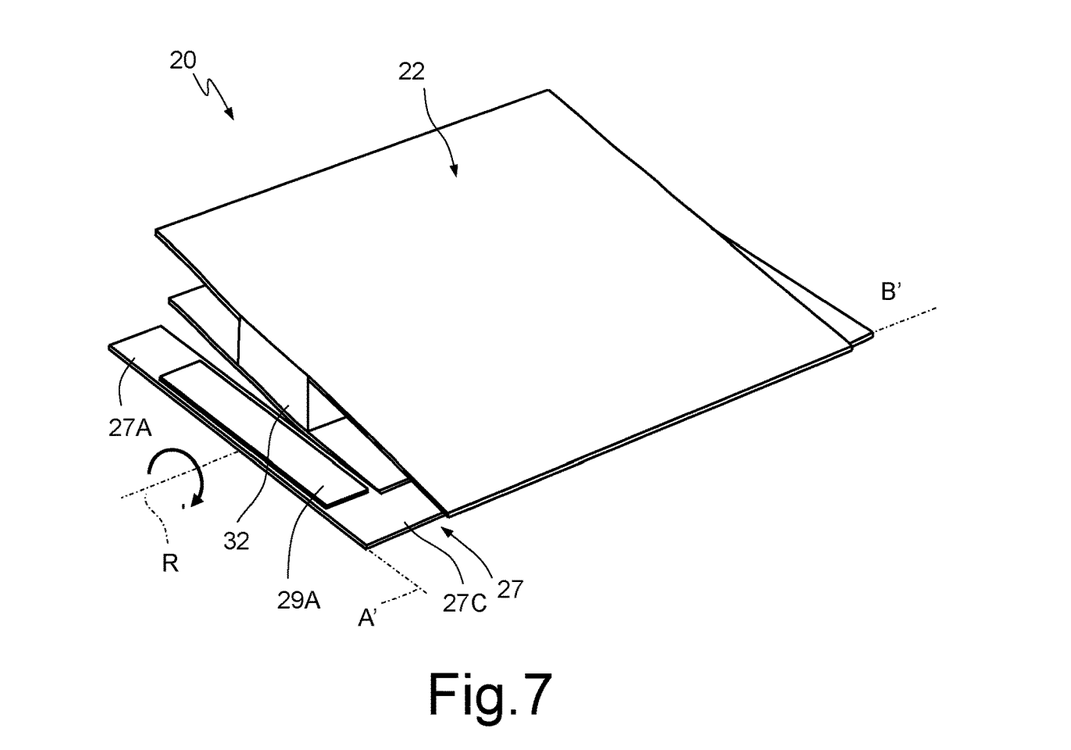
FIG. 7 is a schematic illustration of a simplified perspective view of the microelectromechanical device of FIG. 5 in a second actuation step.

As illustrated in FIGS. 5-7, the micromirror 20 can operate in different operating conditions. In this connection, in order to facilitate understanding of the present device, illustrated in FIGS. 5-7 are just the components of the present micromirror 20 useful for understanding said operating conditions. In particular, the deformable elements 27, the first and second piezoelectric bands 29A, 29B, the pillars 32, and the mobile structure 22, are illustrated in a simplified way.

FIG. 5 shows the resting condition of the micromirror 20. In this condition, the first and second piezoelectric bands 29A, 29B are connected to ground and are parallel to the first plane A'. The mobile structure 22 is stationary and parallel to the second plane B'.

FIG. 6 shows a first operating condition of the micromirror 20. In this first operating condition, a voltage is applied on the first piezoelectric bands 29A (for example, a voltage of 30 V), whereas the second piezoelectric bands 29B are kept at ground. In this way, the first piezoelectric bands 29A undergo deformation so as to cause a consequent deformation of the corresponding first arms 27A of the respective deformable elements 27. To a first approximation, the first and second transverse arms 27C, 27D, the second arms 27B, and the spiral ends 27E remain almost undeformed and rotate in a counterclockwise direction about an axis of rotation R that lies approximately in the plane A' and is parallel to the third axis X. In other words, with reference for simplicity just to the spiral ends 27E, they tilt through a first angle of rotation a with respect to the resting conditions.

The aforementioned rotation also involves the mobile structure 22, since the pillars 32 and the mobile structure 22 itself move fixedly with the spiral ends 27E. Consequently, also the mobile structure 22 tilts through the aforementioned first angle of rotation α.

FIG. 7 shows a second operating condition of the micromirror 20. In this case, a voltage is applied on the second piezoelectric bands 29B (for example, a voltage of 30 V), whereas the first piezoelectric bands 29A are kept at ground. In this way, the second piezoelectric bands 29B undergo deformation so as to cause a consequent deformation of the corresponding second arms 27B of the respective deformable elements 27. It follows that, to a first approximation, the spiral ends 27E rotate in a clockwise direction about the axis of rotation R; i.e., they tilt through a second angle of rotation β with respect to the resting conditions. This rotation also involves the mobile structure 22, which also tilts through the second angle of rotation β. Once again with reference to this second angle of rotation β, this may, for example, be equal to −α.

Figure 8:
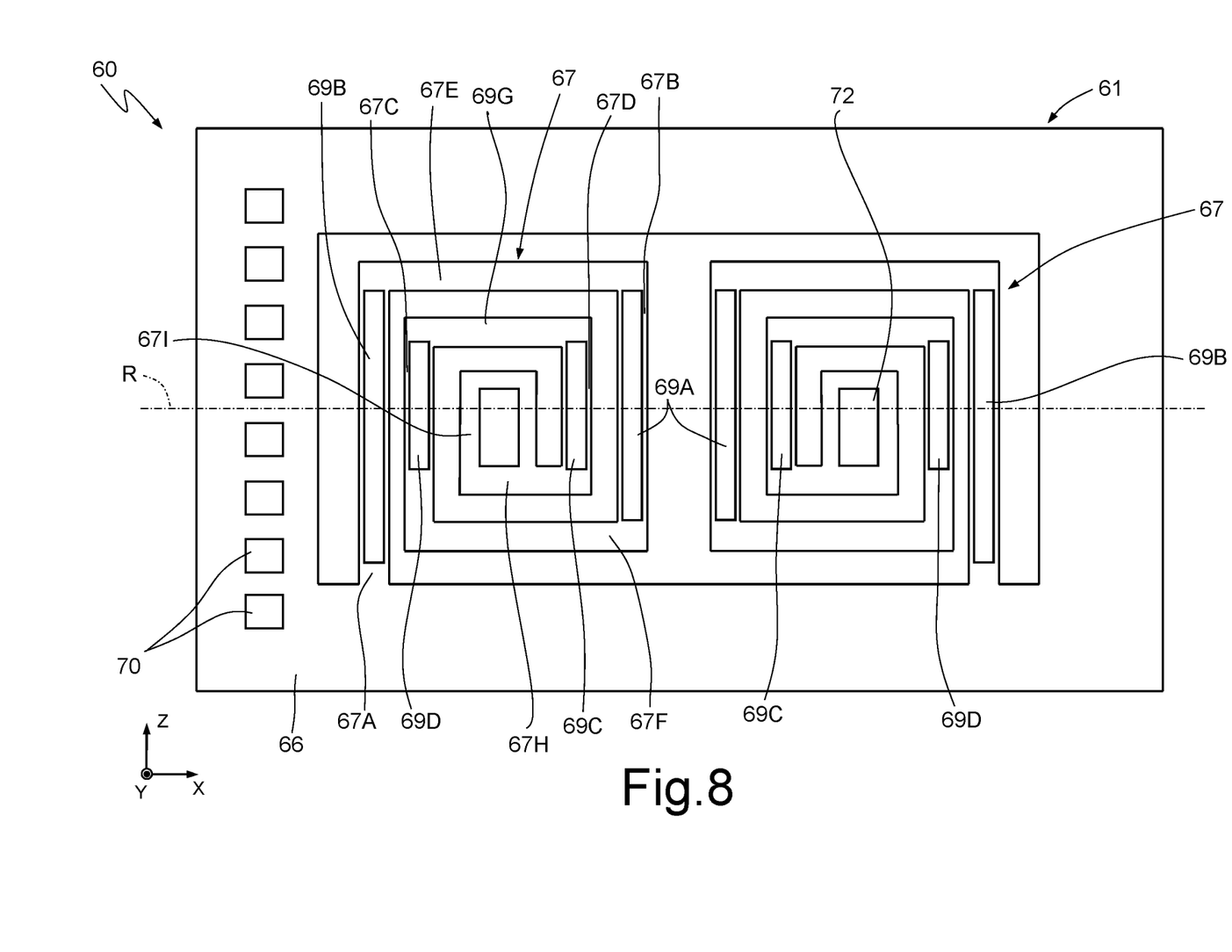
FIG. 8 is a schematic illustration of a top plan view of another embodiment of the present microelectromechanical device, with parts removed.

FIG. 8 shows another embodiment of the present microelectromechanical device, in resting conditions.

In detail, FIG. 8 shows a microelectromechanical device 60 (hereinafter also defined as micromirror 60) having a general structure similar to that of the microelectromechanical device 20 illustrated in FIGS. 2 and 3, so that parts that are similar to the ones illustrated and described with reference to FIGS. 2 and 3 are designated in FIG. 8 by reference numbers increased by 40 and will not be described any further.

The micromirror 60 comprises deformable elements 67, which have, for example, a spiral shape. In detail, the deformable elements 67 comprise a first arm 67A, a second arm 67B, a third arm 67C, and a fourth arm 67D; a first transverse arm 67E, a second transverse arm 67F, a third transverse arm 67G, and a fourth transverse arm 67H; and a spiral end 67I. In particular, the first arm 67A is fixed to the supporting structure 66 and is connected to the second arm 67B by the first transverse arm 67E. Moreover, the second arm 67B is connected to the third arm 67C by the second transverse arm 67F, the third arm 67C is connected to the fourth arm 67D by the third transverse arm 67G, and the fourth arm 67D is connected to the spiral end 67I by the fourth transverse arm 67H. The spiral end 67I of each deformable element 67 is coupled to a respective pillar 72 by the second bonding layer (not visible).

Each deformable element 67 is mechanically coupled to a first piezoelectric band 69A, a second piezoelectric band 69B, a third piezoelectric band 69C, and a fourth piezoelectric band 69D, which extend over the first surface 67' of the deformable elements 67. In detail, the first piezoelectric band 69A is arranged on the first arm 67A; the second piezoelectric band 69B is arranged on the second arm 67B; the third piezoelectric band 69C is arranged on the third arm 67C; and the fourth piezoelectric band 69D is arranged on the fourth arm 67D.

In use, the micromirror 60 is actuated in a way similar to what is described for FIGS. 6 and 7. In greater detail, in the first operating condition, a voltage is applied on the first and third piezoelectric bands 69A, 69C (for example, a voltage of 30 V), and the second and fourth piezoelectric bands 69B, 69D are kept at ground. In this way, the deformable elements 67 are actuated so that they turn in a counterclockwise direction with respect to the axis of rotation R and, consequently, cause a rotation of the mobile structure and of the pillars 72 through the first angle of rotation α.

Likewise, in the second operating step, a voltage is applied on the second and fourth piezoelectric bands 69B, 69D (for example, a voltage of 30 V), and the first and third piezoelectric bands 69A, 69C are kept at ground. In this way, the deformable elements 67 are actuated so that they turn in a clockwise direction with respect to the axis of rotation R and, consequently, cause a rotation of the mobile structure and of the pillars 72 through the second angle of rotation β. In general, the angle of rotation of the mobile structure is the sum of the angles reached by the deformable elements.

Figure 9:
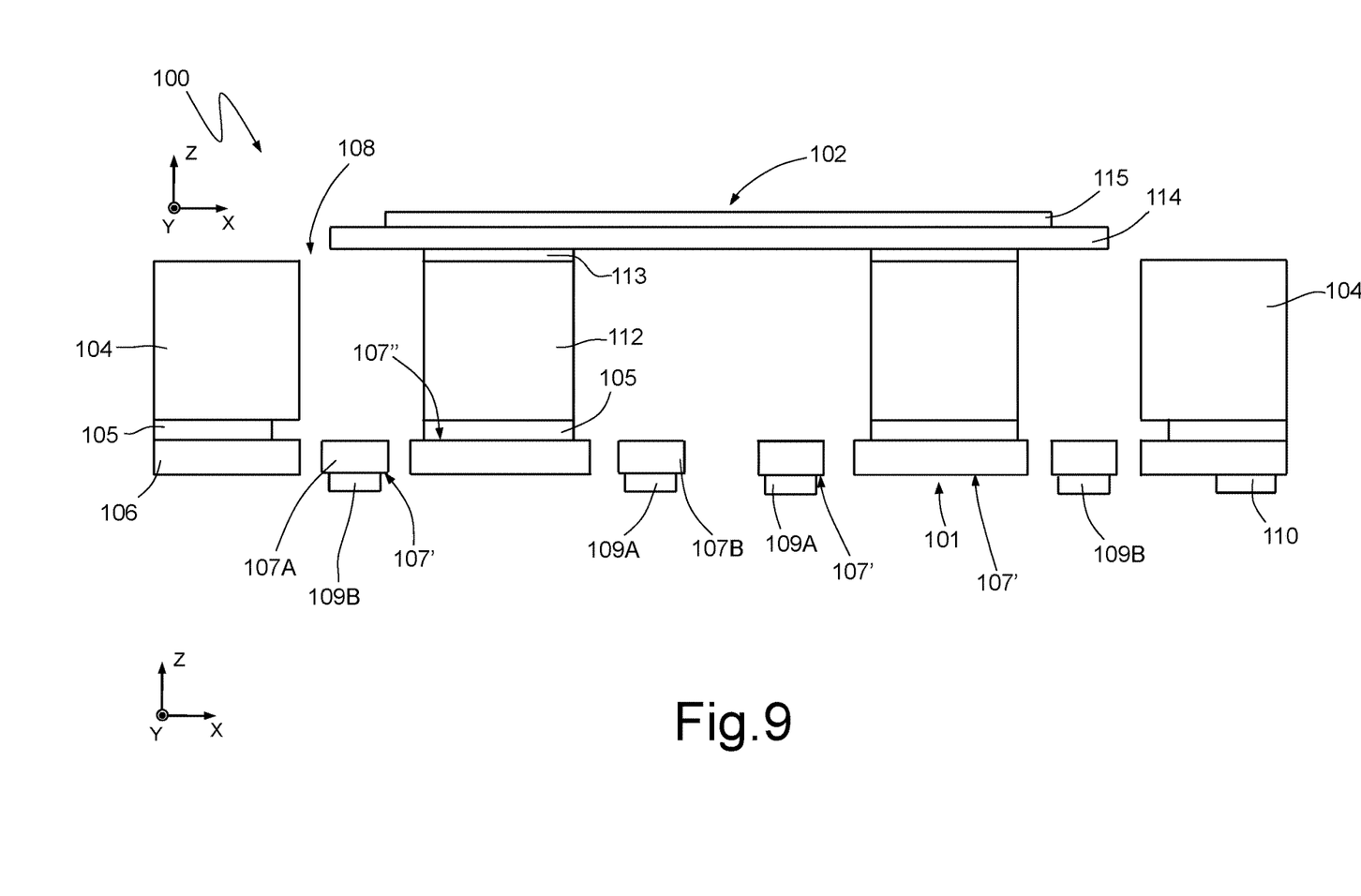
FIG. 9 is a schematic illustration of a cross section of a further embodiment of the present microelectromechanical device.

FIG. 9 shows a further embodiment of the present microelectromechanical device in resting conditions.

In detail, FIG. 9 shows a microelectromechanical device 100 (hereinafter also defined as micromirror 100) having a general structure similar to that of the microelectromechanical device 20 of FIGS. 2 and 3, so that parts that are similar to the ones illustrated and described with reference to FIGS. 2 and 3 are designated in FIG. 9 by reference numbers increased by 80 and will not be described any further. In particular, the micromirror 100 may advantageously be used for applications that require the use of compact devices or else for assemblages, for example, of a flip-chip type.

In greater detail, in this embodiment, the hollow portion (not visible in FIG. 9) of the actuation structure 101 extends underneath the cavity 108. In other words, the actuation structure 101, and hence in particular the deformable elements 107, are arranged underneath the cavity 108, which is hence delimited at the bottom by the actuation structure 101. Consequently, the first surface 107' delimits at the bottom each deformable element 107, which is moreover delimited at the top by a respective second surface 107".

The pillars 112 are once again coupled to the deformable elements 107 by the first bonding layer 105, which extends over the second surfaces 107" of the deformable elements 107. Furthermore, the pillars 112 are coupled to the mobile structure 102 through a third bonding layer 113 (for example, made of polymeric material).

In practice, the pillars 112 extend within the cavity 108, which to a first approximation is delimited at the top by the mobile structure 102, instead of by the actuation structure 101, with consequent reduction of the vertical encumbrance. Even though the actuation structure 101 is not illustrated in FIG. 9, it may extend over a further cavity (not illustrated) so as to be able to undergo deformation, as described previously. This further cavity may be made, for example, using a further layer of semiconductor material (not illustrated). Alternatively, the space for deformation of the actuation structure may be present thanks to the way in which the microelectromechanical device is set in use.

In addition, each pillar 112 is coupled to the surface of the respective deformable element 107 facing the cavity 108 (in the case in point, the second surface 107"). Furthermore, the piezoelectric bands 109 extend underneath the first surfaces 107'.

In use, the micromirror 100 is actuated in a way similar to what has been described previously with reference to FIGS. 6 and 7.

Figure 10:
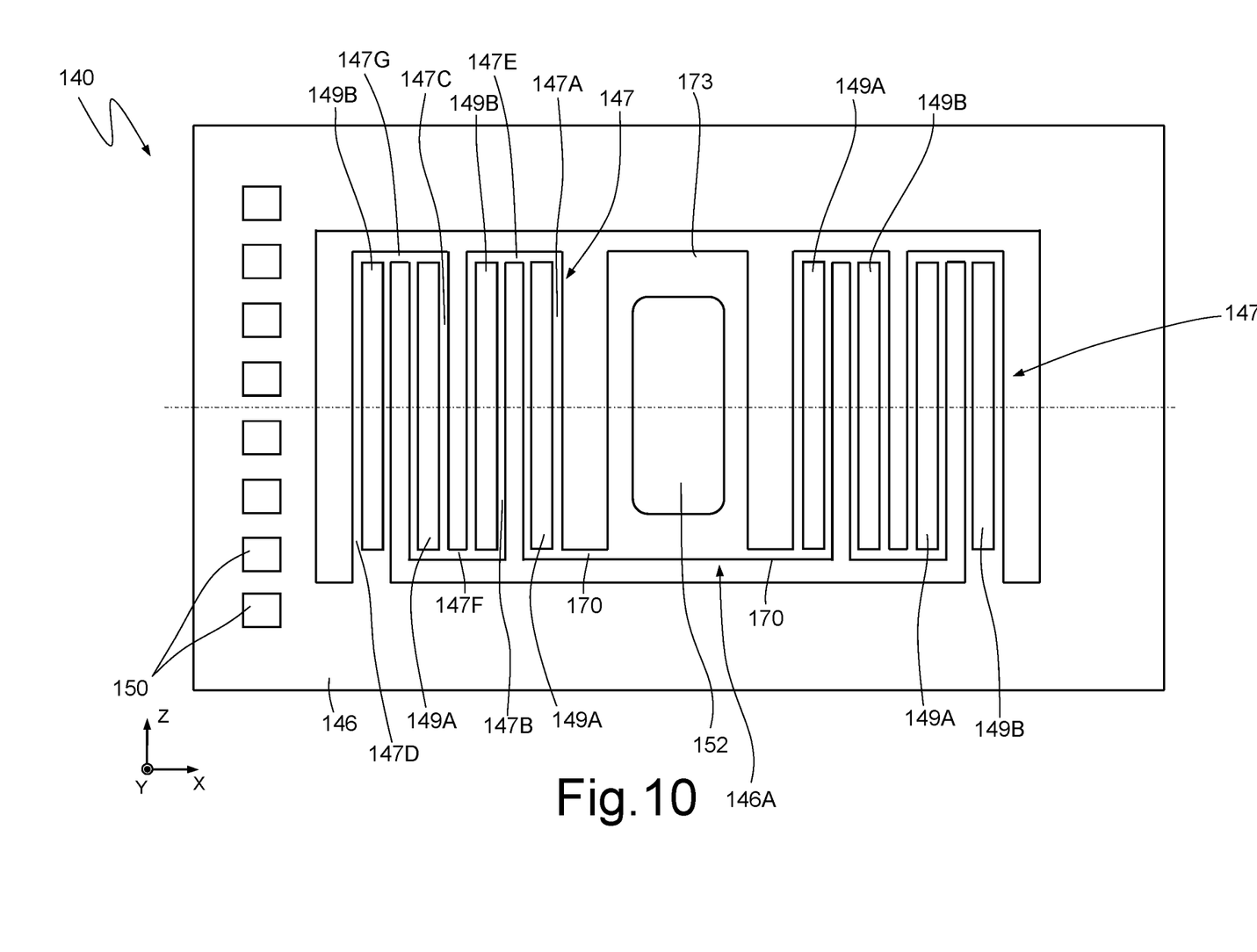
FIG. 10 is a schematic top plan view of a different embodiment of the present microelectromechanical device, with parts removed.

FIG. 10 shows a further embodiment of the present microelectromechanical device, in resting conditions. In detail, FIG. 10 shows a microelectromechanical device 140 (hereinafter also defined as micromirror 140) having a general structure similar to that of the microelectromechanical device 20 of FIGS. 2 and 3, so that parts that are similar to the ones illustrated and described with reference to FIGS. 2 and 3 are designated in FIG. 10 by reference numbers increased by 120 and will not be described any further.

In particular, the deformable elements 147 have a serpentine shape, which includes a plurality of arms (four illustrated and designated by the reference numbers 147A-147D) and a plurality of transverse arms 147E-147G. In particular, the first and second arms 147A, 147B are connected through the first transverse arm 147E; the second and third arms 147B, 147C are connected through the second transverse arm 147F; and the third and fourth arms 147C, 147D are connected through the third transverse arm 147G. In addition, the fourth arm 147D is monolithic with the supporting structure 146 of the actuation structure 141.

The micromirror 140 further comprises pairs of first piezoelectric bands 149A, which are arranged on the first and third arms 147A, 147C, and pairs of second piezoelectric bands 149B, which are arranged on the second and fourth arms 147B, 147D. By so doing, the first and second piezoelectric bands 149A, 149B are spatially alternated with one another in each deformable element 147.

In addition, the micromirror 140 comprises one pillar 152, interposed and mechanically coupled to the mobile structure.

In detail, the pillar 152 is arranged on a platform 173, suspended over the cavity 148 and is located in the hollow portion 146A of the actuation structure 141. The platform 173 is mechanically coupled to the deformable elements 147 by two connection arms 170, which are monolithic with the deformable elements 147. In greater detail, each connection arm 170 mechanically couples the platform 173 and the first arm 147A of each deformable element 147.

In use, the micromirror 140 operates in a way similar to what has been described previously with reference to FIGS. 6 and 7.

Figure 11:
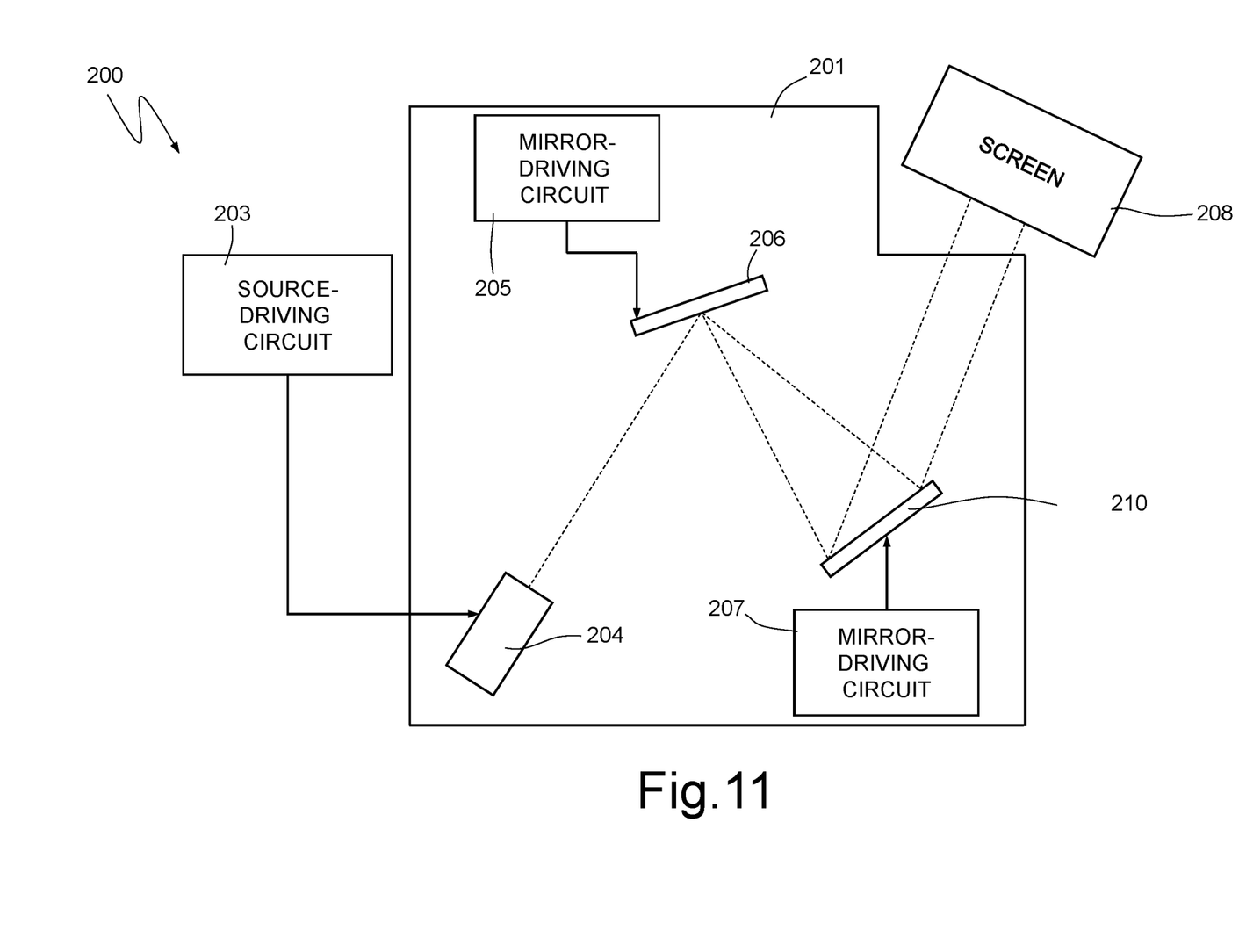
FIG. 11 shows a block diagram of a picoprojector, which uses the present microelectromechanical device.

FIG. 11 shows an example of application of the present microelectromechanical device, obtained according to any one of the embodiments illustrated previously.

In particular, a system 200 comprises: a picoprojector 201, including a light source 204 (which, for example, emits a light beam of a laser type); a resonant mirror 206 operatively coupled to a first mirror-driving circuit 205; and the micromirror (here designated by 210) coupled to a second mirror-driving circuit 207.

Furthermore, the light source 204 is operatively coupled to a source-driving circuit 203; on the other hand, the micromirror 210 is optically coupled to a screen 208, which is also external to the picoprojector 201.

In use, the source-driving circuit 203 controls the light source 204 so as to emit a light beam directed towards the resonant mirror 206. This mirror is in turn controlled by the first mirror-driving circuit 205 so that the light beam will be reflected and sent to the micromirror 210 in order to scan the latter according to a first pattern (not illustrated).

In turn, the micromirror 210 is controlled by the second mirror-driving circuit 207 according to the modalities described with reference to FIGS. 6 and 7 so as to scan the screen 208 according to a further scanning pattern. In this connection, the second mirror-driving circuit 207 can control the micromirror 210 in quasi-static mode, i.e., so as to induce a rotation of the mobile structure at a frequency lower than the resonance frequency of the system formed by the mobile structure and by the deformable elements. By doing so, a particularly precise projection of the light beam is obtained.

Figure 12A:
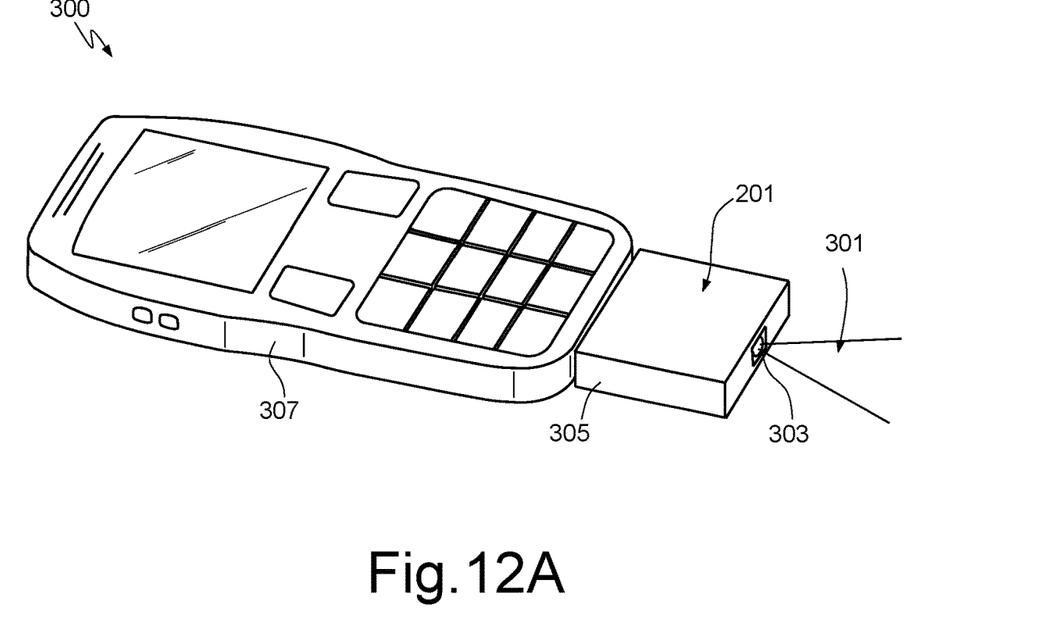
FIGS. 12A and 12B show perspective views of portable electronic apparatuses.

The picoprojector 201 is realized as a stand-alone accessory separate from a portable electronic apparatus 300, for example a mobile phone or smartphone, as illustrated in FIG. 12A. In this case, the picoprojector 201 is coupled to the portable electronic apparatus 300 by appropriate electrical and mechanical connection elements (not illustrated in detail). Furthermore, the picoprojector 201 is equipped with a casing 305 of its own, which has at least one portion 303 transparent to a light beam 301 coming from the micromirror 210. The casing 305 of the picoprojector 201 is releasably coupled to a respective case 307 of the portable electronic apparatus 300.

Figure 12B:
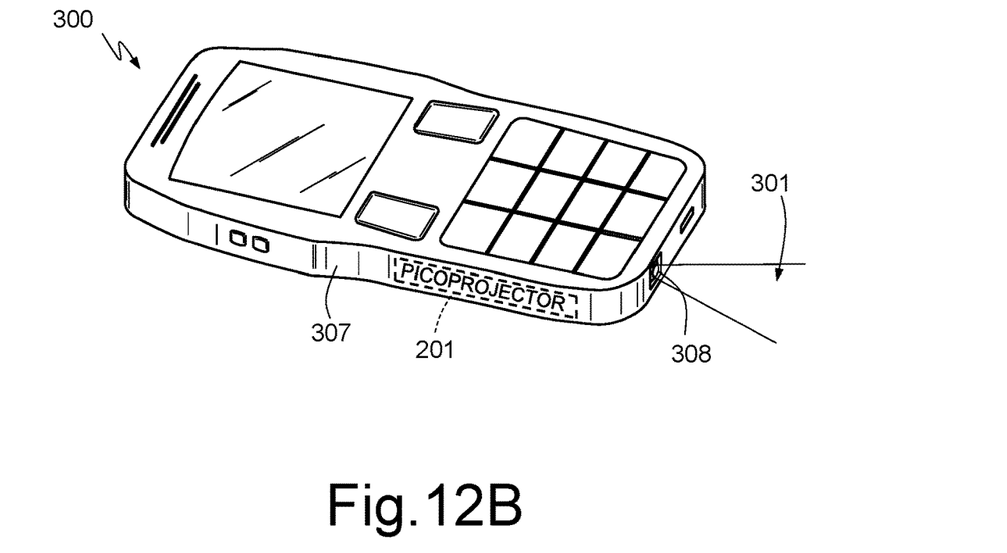

Alternatively, as illustrated in FIG. 12B, the picoprojector 201 may be integrated within the portable electronic apparatus 300 and be set within the case 307 of the portable electronic apparatus 300 itself. In this case, the portable electronic apparatus 300 has a respective portion 308 transparent to the light beam 301 coming from the micromirror 210. The picoprojector 201 is in this case, for example, coupled to a printed circuit board present inside the case 307 of the portable electronic apparatus 300.

The microelectromechanical device described herein presents numerous advantages.

In particular, the present microelectromechanical device is based upon an actuation of a piezoelectric type. Consequently, the voltage required for its operation (about 30 V) is lower than the voltage required by microelectromechanical devices actuated by actuation systems of an electrostatic or electromagnetic type. Consequently, piezoelectric actuation enables the power consumption of the microelectromechanical device to be contained, without this implying any loss in terms of precision and control of definition of the image at output.

In addition, the arrangement in planes on top of one another of the actuation structure and of the mobile structure enables reduction of the area of semiconductor material occupied by the microelectromechanical device.

Finally, it is clear that modifications and variations may be made to the microelectronic device described and illustrated herein, without thereby departing from the scope of protection, as defined in the annexed claims.

For instance, the actuation structure may be different from what has been described. For example, it may include a single deformable element with a spiral shape, which carries a single pillar.

In addition, the arrangement of the piezoelectric bands may be different from what has been described.

More in general, the shape of the deformable elements and the arrangement of the corresponding points of constraint with the semiconductor body and with the pillars may be different from what has been described.

Finally, embodiments are possible, each made up of parts of different embodiments described previously: for example, it is possible to adopt an actuation structure of the type illustrated in FIG. 10 in a device of the type illustrated in FIG. 9.

The invention claimed is:
1. A microelectromechanical device, comprising:
a body of semiconductor material which includes a cavity;
a mobile structure; and
an actuation structure, including a first spirally shaped deformable element which faces the cavity and has an external end mechanically coupled to the body, and a piezoelectric-actuation system configured to be controlled so as to deform said first spirally shaped deformable element and cause a consequent rotation of the mobile structure;

wherein said mobile structure comprises a supporting region and a first pillar region, said supporting region carrying a tiltable element, said first pillar region being mechanically coupled to an internal end of said first spirally shaped deformable element, said supporting region being arranged on top of the first pillar region and overlying at least part of said first spirally shaped deformable element.

2. The microelectromechanical device according to claim 1, wherein said first pillar region extends on top of said first spirally shaped deformable element.

3. The microelectromechanical device according to claim 2, wherein the actuation structure extends underneath the cavity; and wherein said first pillar region extends at least in part inside the cavity.

4. The microelectromechanical device according to claim 1, wherein said supporting region extends laterally so as to entirely overlie said first spirally shaped deformable element.

5. The microelectromechanical device according to claim 1, wherein said actuation structure further comprises a second deformable element which is laterally staggered with respect to the first spirally shaped deformable element and is mechanically coupled to the body and to the mobile structure; and wherein said supporting region overlies at least part of said second deformable element.

6. The microelectromechanical device according to claim 5, wherein the mobile structure comprises a second pillar region, said second pillar region being mechanically coupled to said second deformable element, said supporting region being arranged on top of the second pillar region.

7. The microelectromechanical device according to claim 5, wherein said piezoelectric-actuation system comprises a number of piezoelectric regions mechanically coupled to said second spirally shaped deformable element.

8. The microelectromechanical device according to claim 1, wherein said first spirally shaped deformable element is comprised of semiconductor material.

9. The microelectromechanical device according to claim 1, wherein said supporting region and said first pillar region are made of semiconductor material.

10. The microelectromechanical device according to claim 1, wherein said mobile structure further comprises a reflecting region arranged on the supporting region.

11. The microelectromechanical device according to claim 1, wherein said piezoelectric-actuation system comprises a number of piezoelectric regions mechanically coupled to said first spirally shaped deformable element.

12. A portable electronic apparatus, comprising:
a projective apparatus comprising:
  a light source configured to generate a light beam; and
  a microelectromechanical device configured to receive said light beam and optically coupled to a screen so as to direct said light beam onto the screen;
wherein said microelectromechanical device comprises:
  a body of semiconductor material, which forms a cavity;
  a mobile structure; and
  an actuation structure, including a first spirally shaped deformable element, which faces the cavity and has an external end mechanically coupled to the body, and a piezoelectric-actuation system configured to be controlled so as to deform said first spirally shaped deformable element and cause a consequent rotation of the mobile structure;
wherein said mobile structure comprises a supporting region and a first pillar region, said supporting region carrying a tiltable element, said first pillar region being mechanically coupled to an internal end of said first spirally shaped deformable element, said supporting region being arranged on top of the first pillar region and overlying at least part of said first spirally shaped deformable element; and
wherein said mobile structure further comprises a reflecting region arranged on the supporting region.

13. The portable electronic apparatus according to claim 12, wherein said projective apparatus is a stand-alone accessory having a casing releasably coupled to a corresponding case for said portable electronic apparatus.

14. The portable electronic apparatus according to claim 12, wherein said projective apparatus is formed in an integrated way, within a case for said portable electronic apparatus.

15. The portable electronic apparatus according to claim 12, wherein said first pillar region extends on top of said first spirally shaped deformable element.

16. The portable electronic apparatus according to claim 15, wherein the actuation structure extends underneath the cavity; and wherein said first pillar region extends at least in part inside the cavity.

17. The portable electronic apparatus according to claim 12, wherein said supporting region extends laterally so as to entirely overlie said first spirally shaped deformable element.

18. A microelectromechanical device, comprising:
a body of semiconductor material, which forms a cavity;
a mobile structure; and
an actuation structure including:
  a first spirally shaped deformable element which faces the cavity and has an external end mechanically coupled to the body;
  a first piezoelectric-actuation system configured to be controlled so as to deform said first spirally shaped deformable element and cause rotation of the mobile structure;
  a second deformable element which is laterally staggered with respect to the first spirally shaped deformable element and is mechanically coupled to the body and to the mobile structure; and
  a second piezoelectric-actuation system configured to be controlled so as to deform said second deformable element and contribute to causing rotation of the mobile structure;
wherein said mobile structure comprises:
  a first pillar region, said first pillar region being mechanically coupled to an internal end of said first spirally shaped deformable element;
  a second pillar region, said second pillar region being mechanically coupled to said second deformable element; and
  a supporting region being arranged on top of the first and second pillar regions and overlying at least part of said first spirally shaped deformable element and said second deformable element, said supporting region carrying a tiltable element.

19. The microelectromechanical device according to claim 18, wherein said first pillar region extends on top of said first spirally shaped deformable element, and wherein said second pillar region extends on top of said second deformable element.

20. The microelectromechanical device according to claim 19, wherein the actuation structure extends underneath the cavity; and wherein said first pillar region and said second pillar region extend at least in part inside the cavity.

21. The microelectromechanical device according to claim 18, wherein said supporting region extends laterally so as to entirely overlie said first spirally shaped deformable element.

* * * * *